United States Patent [19]

Cotreau

[11] Patent Number: 4,891,604
[45] Date of Patent: Jan. 2, 1990

[54] HIGH SPEED LOW INPUT CURRENT VOLTAGE FOLLOWER STAGE

[75] Inventor: Gerald M. Cotreau, Melbourne, Fla.

[73] Assignee: Harris Corporation, Melbourne, Fla.

[21] Appl. No.: 289,747

[22] Filed: Dec. 27, 1988

[51] Int. Cl.[4] ............................................. H03F 3/45
[52] U.S. Cl. ................................... 330/252; 330/259; 330/290
[58] Field of Search ................. 330/76, 156, 252, 259, 330/261, 290, 296

[56] References Cited

U.S. PATENT DOCUMENTS

| | | | |
|---|---|---|---|
| 4,250,460 | 2/1981 | Gasparik | 330/252 |
| 4,560,948 | 12/1985 | Prentice et al. | 330/282 |
| 4,584,535 | 4/1986 | Seevinck | 330/257 |
| 4,636,743 | 1/1987 | Cotreau | 330/295 |
| 4,636,744 | 1/1987 | King et al. | 330/295 |

*Primary Examiner*—Steven Mottola
*Attorney, Agent, or Firm*—Barnes & Thornburg

[57] ABSTRACT

A voltage follower input stage having a correction or bootstrap circuit to effectively remove the parasitic capacitance by bootstrapping the capacitance so that both sides of the parasitic capacitance follows voltage level changes.

23 Claims, 2 Drawing Sheets

U.S. Patent   Jan. 2, 1990   Sheet 1 of 2   4,891,604
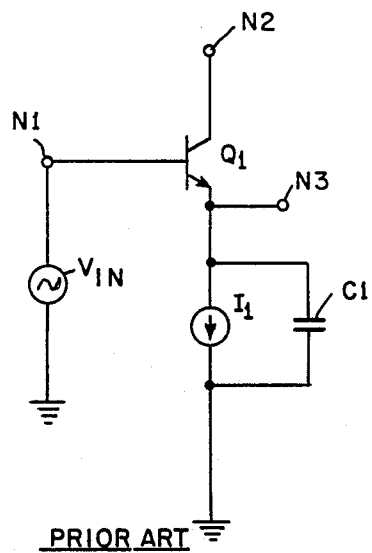
FIG. 1A  PRIOR ART
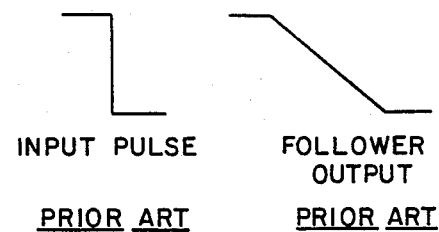
INPUT PULSE
PRIOR ART
FIG. 1B
FOLLOWER OUTPUT
PRIOR ART
FIG. 1C
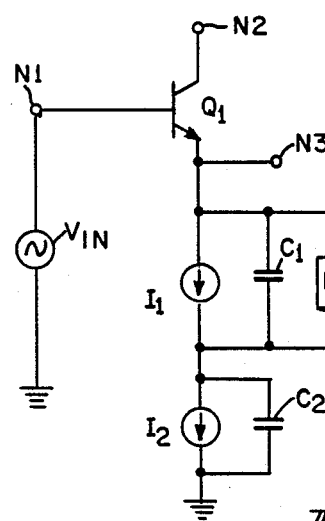
FIG. 2A
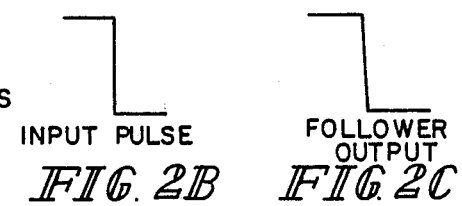
INPUT PULSE
FIG. 2B
FOLLOWER OUTPUT
FIG. 2C

HIGH SPEED LOW INPUT CURRENT VOLTAGE FOLLOWER STAGE

BACKGROUND AND SUMMARY OF THE INVENTION

The present invention relates generally to voltage followers stages and more specifically to an improved slew rate for low input current, voltage follower.

Slew rate of operational amplifiers is defined as the maximum rate of change of the output signal in response to changes in the input signal. Ideally, the amplifier output, under large signal conditions, should follow the input signal. However, limitations on the slew rate cause the amplifier output response to be slower than the rate of change of the large input signal. The greater the slew rate, the more closely the output signal follows the input signal. Various techniques have been developed to increase the slew rate of operational amplifiers.

One of the prior art techniques is described in U.S. Pat. No. 4,250,460 to Gasparik. A uniquely defined capacitance is connected in parallel to the common current source of a differential pair to increase the slew rate.

As discussed in U.S. Pat. No. 4,560,948 to Prentiss et al., the increasing of the transconductance of a stage also increases the bandwidth and slew rate.

A limiting factor on the slew rate is the output capacitance. The slew rate is proportional to the output current divided by the output capacitance. One solution to this problem is to increase the slewing current when needed such that the ratio of the output current to the output capacitance is greater during slewing conditions. This method is described in U.S. Pat. Nos. 4,636,743 to Cotreau and 4,636,744 to King et al.

Other nodes or points in other types of circuits have parasitic capacitance which limit the slew rate of the node. The output node of a voltage follower stage illustrated in FIG. 1A is an example. As in operational amplifiers, increasing the current at the node will improve the slew rate. This is not desirable in some applications. Another distinction between operational amplifiers and parasitic capacitance at other circuit nodes is that the capacitor in the operational amplifier which determines the slew rate must always have one terminal grounded to achieve compensation. Other circuit nodes may not have this limitation.

It is an object of the present invention to provide another method of increasing the slew rate of circuit nodes. Another object of the present invention is to increase the slew rate of current follower stages.

Still another object of the present invention is to provide a voltage follower stage having increased slew rate which is capable of receiving low input currents.

These and other objects are obtained by providing a correction or bootstrap circuit in a voltage follower stage so as to effectively remove the parasitic capacitance by bootstrapping the capacitance so that both sides of the parasitic capacitance follows voltage level changes. In a circuit having a first transistor wherein the input is applied to the base and the output is taken off the collector-emitter path which is connected to a current source, the bootstrap circuit is connected in parallel to the current source for causing both sides of the parasitic capacitance of the current source to follow changes of voltage at the point of connection to the emitter-collector path of the first transistor. The bootstrapping circuit generally includes a second transistor having its base connected to the emitter-collector path of the first transistor and its emitter-collector path connected to the current source. The current source itself can include a third transistor, acting as a first small current source, having its emitter-collector path connected in series with the emitter-collector path of the first transistor and a base connected to the emitter-collector path of the second transistor. The second transistors' emitter-collector path is connected to a second, larger current source by a diode and the other end of the emitter-collector path of the third transistor is also connected to the same current source. The third transistor and the diode are sized such that the second transistor carries substantially more current than the first transistor by at least ten times. A level shifter may be provided at the output of the second transistor.

The bootstrap concept may also be applied to each leg of a differential amplifier having differential voltage inputs and differential current outputs. The main current source and the diode of the second transistors in the differential amplifier are common to each leg. A bootstrap circuit may be provided for the second transistor also.

Other objects, advantages and novel features of the present invention will become apparent from the following detailed description of the invention when considered in conjunction with the accompanying drawings.

BRIEF DESCRIPTION OF THE DRAWINGS

FIGS. 1a, 1b and 1c are a schematic diagram and graph of an input pulse and resulting output signal for an emitter-follower of the prior art, respectively.

FIGS. 2a, 2b and 2c are schematic diagrams and graphs of input pulse and output signal for an emitter-follower circuit according to the principles of the present invention.

DETAILED DESCRIPTION OF THE DRAWINGS

FIG. 1a shows a transistor Q1 having an alternating current source V-IN connected at node N1 to its base. The emitter-collector path of Q1 is connected between node N2 and ground in series with a current source I1. The output is at node N3 creating an emitter-follower stage. When the input signal of FIG. 1B is applied to the base of Q1, the output signal which is a voltage as illustrated in FIG. 1C, is produced. You will note that as the input signal goes from positive to negative, the output signal has a long transition stage which shows slow slewing resulting from parasitic capacitance at node N3 from the current source I1. The emitter of Q1, which is the point at which the output is taken at node N3, cannot follow the base since the current source I1 must slew its parasitic capacitance C1. The designer must ensure that the emitter slew rate, namely, output current I divided by capacitance C1, is fast enough for anticipated input ramp rates. The current source I1 is a low current source and therefor increasing the current source to improve the slew rate at node N3 will change the operating characteristics of the node.

The present invention, as illustrated in the schematic of FIG. 2A, provides a bootstrap circuit BS in parallel with the parasitic capacitance C1, which is inherent in the current source I1. The input signal at the base of Q1 is at node N1. The bootstrap circuit causes both sides of the parasitic capacitor C1 to maintain the same charge and thereby effectively removes the capacitor from affecting the output node N3 during transitions of voltage on the node N3 from the emitter of transistor Q1.

A large current source I2 connects the small current source to ground. The current source I2 has a parasitic capacitance C2 which has a high slew rate since the current source I2 is large. The current source I2 is chosen to be large enough to compensate for any parasitic capacitance in the bootstrap circuit BS. Since I1 + IBS = I2, the compensation circuit does not effect the operating characteristics of node 3. In effect, the design effectively removes all parasitic capacitances from small current portions of the circuit and replaces with parasitic capacitances in large current portions of the circuit wherein the slew rate is increased by the large current.

The input pulse of FIG. 2B appears at the output as an almost substantially rectangular output pulse 2C. A comparison of FIG. 2C to 1C will show the improvement in slew rate produced by the present invention.

Although the bootstrapping circuit BS may be a stand-alone, it is more efficient to implement the bootstrap circuit BS using the stage being driven by the follower. In this way, the devices necessary for the operation of the stage being driven by the input follower would serve dual purpose when they also provide bootstrapping for the input follower stage. This basic concept is illustrated in FIG. 3.

Figure 3:
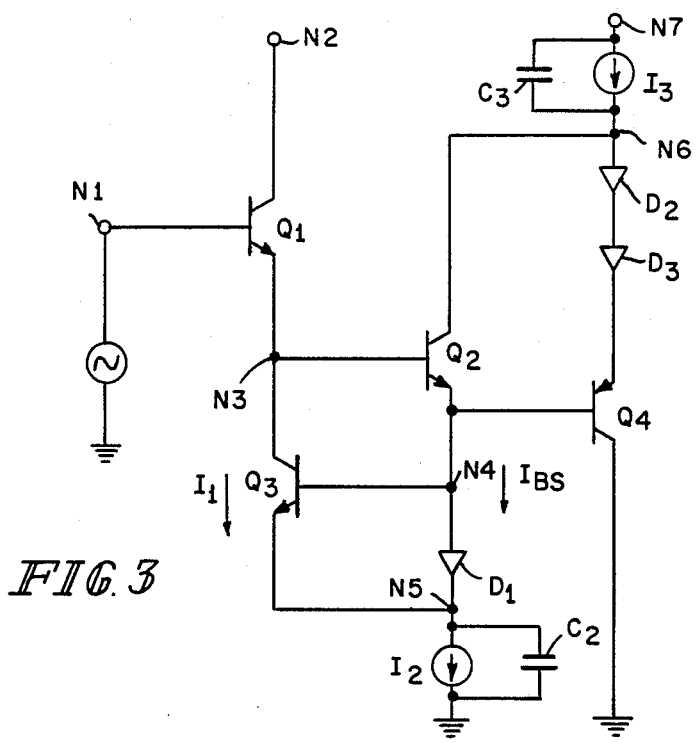
FIG. 3 is a detailed schematic of an emitter-follower incorporating the principles of the present invention.

As illustrated in FIG. 3, the input transistor Q1 being in a follower configuration, includes a driven device Q2 having its base connected at node N3 to the emitter-collector path of Q1. The transistor Q2 may be another follower device or half of a differential pair. A third transistor Q3 has its emitter-collector path connected to node N3 and the current source I2. The transistor Q3 is a portion of the current source I1. The base of Q3 is connected to the emitter-collector path of the driven transistor Q2. At node N4, diode D1 connects the emitter-collector path of the driven transistor Q2 to the common current source I2.

The driven transistor Q2 forms not only an output device, but its base-to-emitter path between nodes N3 and N4, bootstraps or biases both ends of the parasitic capacitance C1 of the current source I1 represented by transistor Q3. This bootstrapping maintains both ends of the parasitic capacitance at the same voltage and therefore effectively removes the parasitic capacitance from the node N3 which is the output of the emitter-follower circuit. Thus, with the change of the input signal, the output signal need not slew or change the charge on the parasitic capacitor of the current source I1.

The parasitic capacitance of the base collector junction of Q2 between nodes N3 and N6 is bootstrapped by transistor Q4. The base of Q4 is connected to the emitter-collector path of Q2 and the emitter-collector path of Q4 is connected with series connected diodes D2, D3 between node N6 and ground. Another large current source I3 and its parasitic capacitance C3, are connected to node N6. Thus the slew rate at nodes N3, N4 and N6 is very high with all parasitic capacitances compensated by either bootstrapping or large current.

An output can be taken at nodes N3, N4 and N6. The transistor Q4 and diodes D2 and D3 form a level shifter. Thus the output at node N4 is shifted at node N6.

The diode D1 is selected to be relatively large compared to transistor Q3 such that the bootstrap current IBS in the emitter-collector or bootstrap path of Q2 is a substantial portion of the current I2 from current source I2 compared to the current I1 carried by the emitter-collector path of Q1. The current IBS should preferably be greater than ten times the current in I1. Although the parasitic capacitance at the emitter of Q1 must be slewed, the COB of Q2 and Q3 are bootstrapped by Q4 and Q2 respectively and therefore will follow the input and no charge has to be removed. Since the capacitance C1 of the current source Q3 has been removed, the current through Q1 can be very small to increase the I/C ratio. The slew rate of node N3 is large since the capacitance is substantially zero.

Figure 4:
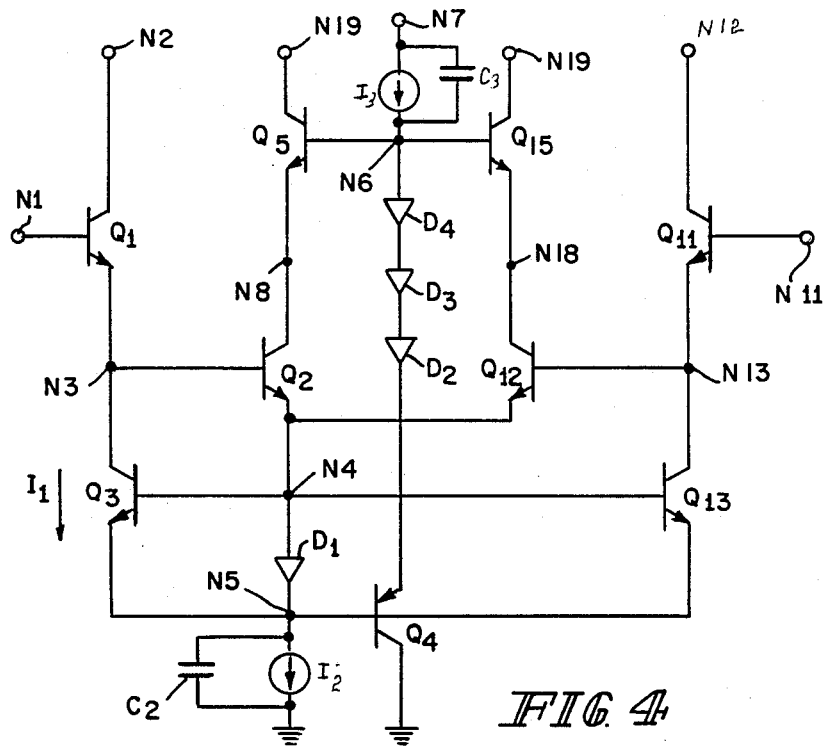
FIG. 4 is a schematic of a differential input stage incorporating the principles of the present invention.

The application of the present concept to a differential input stage is illustrated in FIG. 4. The transistors and nodes of the two legs having similar functions, have the same units number. The two input devices Q1 and Q11 receive differential voltage inputs and provide different current outputs on nodes N9 and N19, respectively. The input transistors Q1 and Q11 are emitter-followers connected to drive devices Q2 and Q12, respectively. The correction circuit of the standard design includes the transistors Q3 and Q13 as current source I1 having their emitter-collector paths connected to the common current source I2 for both legs and their bases connected to node N4 which is common to the emitters of bootstrap transistors Q2 and Q12. A single diode D1 connects the node N4, which is the common emitters of Q2 and Q12 and the common bases of Q3 and Q13, to the common current source I2 at node N5. Transistors Q5 and Q15 have their emitter-collector paths connected to the emitter-collector path of Q2 between nodes N8, N18 and outputs N9, N19, respectively. These devices Q5, Q15 are shielding devices for Q2 and Q12 for improved rejection ratios and also serve to bootstrap the capacitance COB of Q2 and Q12. The bases of Q5 and Q15 are connected at node N6 to the current source I3. Diodes D2, D3, D4 connect node N6 to the emitter-collector path of Q4, which has its base connected to node N5 to the current source I1. D2, D3, D4 and Q4 operate as the level shifter follower. The level shifter D2, D3, D4, Q4 in combination with transistors Q5, Q15 also acts as the bootstrap for the capacitance of the transistors at the output of transistors Q2 and Q12.

Although the present invention has been described and illustrated in detail, it is to be clearly understood that the same is by way of illustration and example only, and is not to be taken by way of limitation. The spirit and scope of the present invention are to be limited only by the terms of the appended claims.

What is claimed is:

1. Low input current voltage follower stage comprising:

first transistor having a base connected to an input terminal and having an emitter-collector path connected at a first end to a first reference terminal;

a current source means connecting a second end of said first transistor's emitter-collector path to a second reference terminal and including a parasitic capacitance between a first and second terminal;

said bootstrap means connected in parallel to said current source means first and second terminal for causing both sides of said parasitic capacitance to follow changes of voltage at said second end of said first transistor's emitter-collector path; and bootstrap means including a second transistor having a base connected to said second end of said first transistor's emitter-collector path and said first terminal of said current source means and having a second end of said second transistor's emitter-collector path connected to said second terminal of said current source means.

2. A follower stage according to claim 1, wherein said current source means includes third transistor having a first end of an emitter-collector path connected to said current source means first terminal and having a base connected to said current source means second terminal.

3. A follower stage according to claim 2, wherein said current source means includes a first current source connecting a second end of said third transistor's emitter-collector path to said second reference terminal.

4. A follower stage according to claim 3, including a diode connecting said second end of said second transistor's emitter to said first current source.

5. A follower stage according to claim 4, wherein said third transistor is substantially smaller than said diode so that said second transistor conducts substantially more current than said first transistor.

6. A follower stage according to claim 5, wherein said third transistor and said diode are sized so that said second transistor conducts at least ten times the current that said first transistor conducts.

7. A follower stage according to claim 1, including a level shifting means connected to said second transistor's emitter-collector path.

8. A follower stage according to claim 7, wherein said level shifter means includes:
   a second current source connecting said first end of said second transistor's emitter-collector path to said first reference terminal; and
   a fourth transistor having emitter-collector path connected between a first end of said second transistor's emitter-collector path and said second reference terminal and having a base connected to said second end of said second transistor's emitter-collector path.

9. A follower stage according to claim 1, wherein said bootstrap means includes a second bootstrap means connected in parallel to said emitter-collector path of said second transistor for causing both sides of the base-collector capacitance of said second transistor to follow change of voltage at said second end of said first transistor's emitter-collector path.

10. Low input current voltage follower stage comprising:
   first transistor having a base connected to an input terminal and having an emitter-collector path connected at a first end to a first reference terminal;
   a current source means connecting a second end of said first transistor's emitter-collector path to a second reference terminal, including a parasitic capacitance between a first and second terminal, and including third transistor having a first end of a emitter-collector path connected to said current source means first terminal and having a base connected to said current source means second terminal; and
   bootstrap means connected in parallel to said current source means first and second terminal for causing both sides of said parasitic capacitance to follow changes of voltage at said second end of said first transistor's emmitter-collector path.

11. A follower stage according to claim 10, wherein said current source means includes a first current source connecting a second end of said third transistor's emitter-collector path to said second reference terminal.

12. A follower stage according to claim 11, including a diode connecting said bootstrap means to said first current source.

13. A follower stage according to claim 12, wherein said third transistor is substantially smaller than said diode so that said bootstrap means conducts substantially more current than said first transistor.

14. Low input current voltage follower stage comprising:
   first transistor having a base connected to an input terminal and having an emitter-collector path connected at a first end to a first reference terminal;
   a current source means connecting a second end of said first transistor's emittercollector path to a second reference terminal, including a parasitic capacitance between a first and second terminal, including a first current source connected between said current source means first and second terminals, and including a second current source connected between said current source means second terminal and said second reference terminal; and
   bootstrap means connected in parallel to said current source means first and second terminal for causing both sides of said parasitic capacitance to follow changes of voltage at said second end of said first transistor's emitter-collector path.

15. A follower stage according to claim 14, wherein said second current source having a substantially larger current capacity than said first current source.

16. A follower stage according to claim 15, wherein said bootstrap means and said first current source are sized so that said bootstrap means conducts substantially more current than said first current source.

17. A differential input stage having first and second legs, each connected between a first reference terminal and a first common current source, each leg including:
   input and output terminals;
   a first transistor having a base connected to said input terminal and having an emitter-collector path connected at a first end to said first reference terminal;
   a second transistor having a base connected to a second end of said first transistor's emitter-collector path and having an emitter-collector path connected at a first end to said output terminal; and
   cancellation means connected between a second end of said second transistor's emitter-collector path, said second end of said first transistor's emitter-collector path and said first common current source for cancelling parasitic capacitance at said second end of said first transistor's emitter-collector path.

18. A differential input stage according to claim 17, wherein said cancellation means includes a third transistor, having a base connected to said second end of said second transistor's emitter-collector path, and having an emitter-collector path connecting said second end of said first transistor's emitter-collector path to said first common current source.

19. A differential input stage according to claim 18, wherein said second ends of said second transistor's emitter-collector paths of both legs are connected together and to said first common current source by a common diode.

20. A differential input stage according to claim 19, wherein said third transistors each are substantially smaller than said common diode so that said second transistors conduct substantially more current than said first transistors.

21. A differential input state according to claim 17, including a second common current source; and wherein each of said legs includes a fourth transistor having a base connected to said second common current source and having an emitter-collector path connected between said output terminal and said first end of said second transistor's emitter-collector path.

22. A differential input stage according to claim 21, including bootstrap means connected to said fourth transistor's bases and said second ends of said second transistor's emitter-collector path for causing both sides of a parasitic capacitor at said first end of said second transistor's emitter-collector path to follow changes of voltage at said first end of said second transistor's emitter-collector path.

23. A differential input stage according to claim 22, wherein said bootstrap means includes a fifth transistor having a base connected to said second ends of said second transistor's emitter-collector path and includes an emitter-collector path connected at one end to said bases of said fourth transistors.

* * * * *